United States Patent
Kai

(10) Patent No.: US 12,154,954 B2
(45) Date of Patent: Nov. 26, 2024

(54) SEMICONDUCTOR DEVICE AND MANUFACTURING METHOD THEREOF

(71) Applicant: NANYA TECHNOLOGY CORPORATION, New Taipei (TW)

(72) Inventor: Wan Yu Kai, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 18/496,937

(22) Filed: Oct. 30, 2023

(65) Prior Publication Data
US 2024/0063273 A1 Feb. 22, 2024

Related U.S. Application Data

(62) Division of application No. 17/456,572, filed on Nov. 24, 2021, now Pat. No. 11,948,982.

(51) Int. Cl.
*H01L 29/40* (2006.01)
*H01L 29/417* (2006.01)
*H01L 29/45* (2006.01)

(52) U.S. Cl.
CPC ...... *H01L 29/401* (2013.01); *H01L 29/41766* (2013.01); *H01L 29/456* (2013.01)

(58) Field of Classification Search
CPC ............ H01L 29/401; H01L 29/41766; H01L 29/456; H01L 29/66568; H01L 21/28518; H01L 21/76805; H01L 21/76814; H01L 21/76831; H01L 21/76858; H01L 21/76829
See application file for complete search history.

(56) References Cited

U.S. PATENT DOCUMENTS

| 10,163,720 B2* | 12/2018 | Kuo | H01L 21/823475 |
| 10,170,360 B2* | 1/2019 | Adusumilli | H01L 21/76883 |
| 2012/0032275 A1* | 2/2012 | Haran | H01L 23/485 257/E21.409 |
| 2016/0181383 A1* | 6/2016 | Huang | H01L 21/302 257/757 |
| 2016/0336412 A1* | 11/2016 | Hung | H01L 29/66545 |

FOREIGN PATENT DOCUMENTS

TW 202036909 A 10/2020

* cited by examiner

*Primary Examiner* — Shahed Ahmed
*Assistant Examiner* — Khatib A Rahman
(74) *Attorney, Agent, or Firm* — CKC & Partners Co., LLC

(57) ABSTRACT

A manufacturing method of a semiconductor device includes forming a contact opening in a wafer. The wafer includes a substrate, a gate structure over the substrate and a dielectric layer over the substrate and surrounding the gate structure, and the contact opening passes through the dielectric layer and exposes the substrate. A recess is formed in the substrate such that the recess is connected to the contact opening. An oxidation process is performed to convert a portion of the substrate exposed in the recess to form a protection layer lining a sidewall and a bottom surface of the recess. The protection layer is etched back to remove a first portion of the protection layer in contact with the bottom surface of the recess of the substrate. A metal alloy structure is formed at the bottom surface of the recess of the substrate.

10 Claims, 7 Drawing Sheets

SEMICONDUCTOR DEVICE AND MANUFACTURING METHOD THEREOF

CROSS-REFERENCE TO RELATED APPLICATION

The present application is a Divisional Application of the U.S. application Ser. No. 17/456,572, filed Nov. 24, 2021, which is herein incorporated by reference in its entirety.

BACKGROUND

Field of Disclosure

The present disclosure relates to a semiconductor device and a manufacturing method thereof.

Description of Related Art

A variety of semiconductor devices are used extensively in many consumer products. As the semiconductor technology has progressed into nanoscale technology, the sizes of the semiconductor devices and the components therein are gradually reduced. However, the scaling down process of the semiconductor devices faces difficulties and leads to some challenges that should to be solved.

SUMMARY

In accordance with some embodiments of the present disclosure, a manufacturing method of a semiconductor device includes forming a contact opening in a wafer. The wafer includes a substrate, a gate structure over the substrate and a dielectric layer over the substrate and surrounding the gate structure, and the contact opening passes through the dielectric layer and exposes the substrate. A recess is formed in the substrate such that the recess is connected to the contact opening. An oxidation process is performed to convert a portion of the substrate exposed in the recess to form a protection layer lining a sidewall and a bottom surface of the recess of the substrate. The protection layer is etched back to remove a first portion of the protection layer in contact with the bottom surface of the recess of the substrate such that a second portion of the protection layer is in contact with the sidewall of the recess of the substrate. A metal alloy structure is formed at the bottom surface of the recess of the substrate.

In accordance with some embodiments of the present disclosure, oxygen is introduced to the contact opening of the dielectric layer and the recess of the substrate to convert the portion of the substrate exposed in the recess to the protection layer.

In accordance with some embodiments of the present disclosure, hydrogen is introduced accompanied by introducing oxygen to the contact opening of the dielectric layer and the recess of the substrate.

In accordance with some embodiments of the present disclosure, the protection layer is silicon oxide layer.

In accordance with some embodiments of the present disclosure, the method further includes forming a contact in the contact opening after forming the metal alloy structure at the bottom surface of the recess of the substrate.

In accordance with some embodiments of the present disclosure, forming the contact in the contact opening is such that the contact is in contact with the dielectric layer and the second portion of the protection layer.

In accordance with some embodiments of the present disclosure, forming the contact in the contact opening is further such that a portion of the contact in contact with the dielectric layer is greater in width than a portion of the contact in contact with the second portion of the protection layer.

In accordance with some embodiments of the present disclosure, forming the metal alloy structure at the bottom surface of the recess of the substrate includes depositing a metal layer over the bottom surface of the recess of the substrate, and performing an annealing process to the metal layer such that a portion of the metal layer reacts to the substrate to form the metal alloy structure.

In accordance with some embodiments of the present disclosure, performing an annealing process to the metal layer is such that the metal alloy structure extends downwards to form in a triangle shape.

In accordance with some embodiments of the present disclosure, the oxidation process is an in-situ steam generation (ISSG) process.

In accordance with some embodiments of the present disclosure, a semiconductor device includes a substrate, a gate structure over the substrate, a dielectric layer over the substrate and surrounding the gate structure, a contact extending in the dielectric layer to the substrate and a metal alloy structure at the bottom of the contact. The metal alloy structure extends downwards and has a triangle shape in a cross-sectional view.

In accordance with some embodiments of the present disclosure, the semiconductor device further includes a protection layer surrounding a portion of the contact embedded in the substrate.

In accordance with some embodiments of the present disclosure, an inner sidewall of the protection layer is shifted inwards from a sidewall of the contact.

In accordance with some embodiments of the present disclosure, the protection layer is a silicon oxide layer.

In accordance with some embodiments of the present disclosure, a bottom surface of the metal alloy structure is lower than a bottom surface of the protection layer.

In accordance with some embodiments of the present disclosure, a top surface of the protection layer is lower than a top surface of the contact.

In accordance with some embodiments of the present disclosure, the semiconductor device further includes an etch stop layer between the dielectric layer and the substrate extending from the gate structure to the contact. The etch stop layer is in contact with the contact and the protection layer.

In accordance with some embodiments of the present disclosure, the protection layer is in contact with a bottom surface of the etch stop layer.

In accordance with some embodiments of the present disclosure, the semiconductor device further includes a source/drain region, wherein the metal alloy structure is in the source/drain region.

In accordance with some embodiments of the present disclosure, the metal alloy structure includes cobalt.

The protection layer of the present disclosure is a layer formed inwards in the substrate, so the protection layer does not reduce the width of the recess and contact opening. The subsequently formed material in the recess and the contact opening is more easily formed in the recess and the contact opening.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
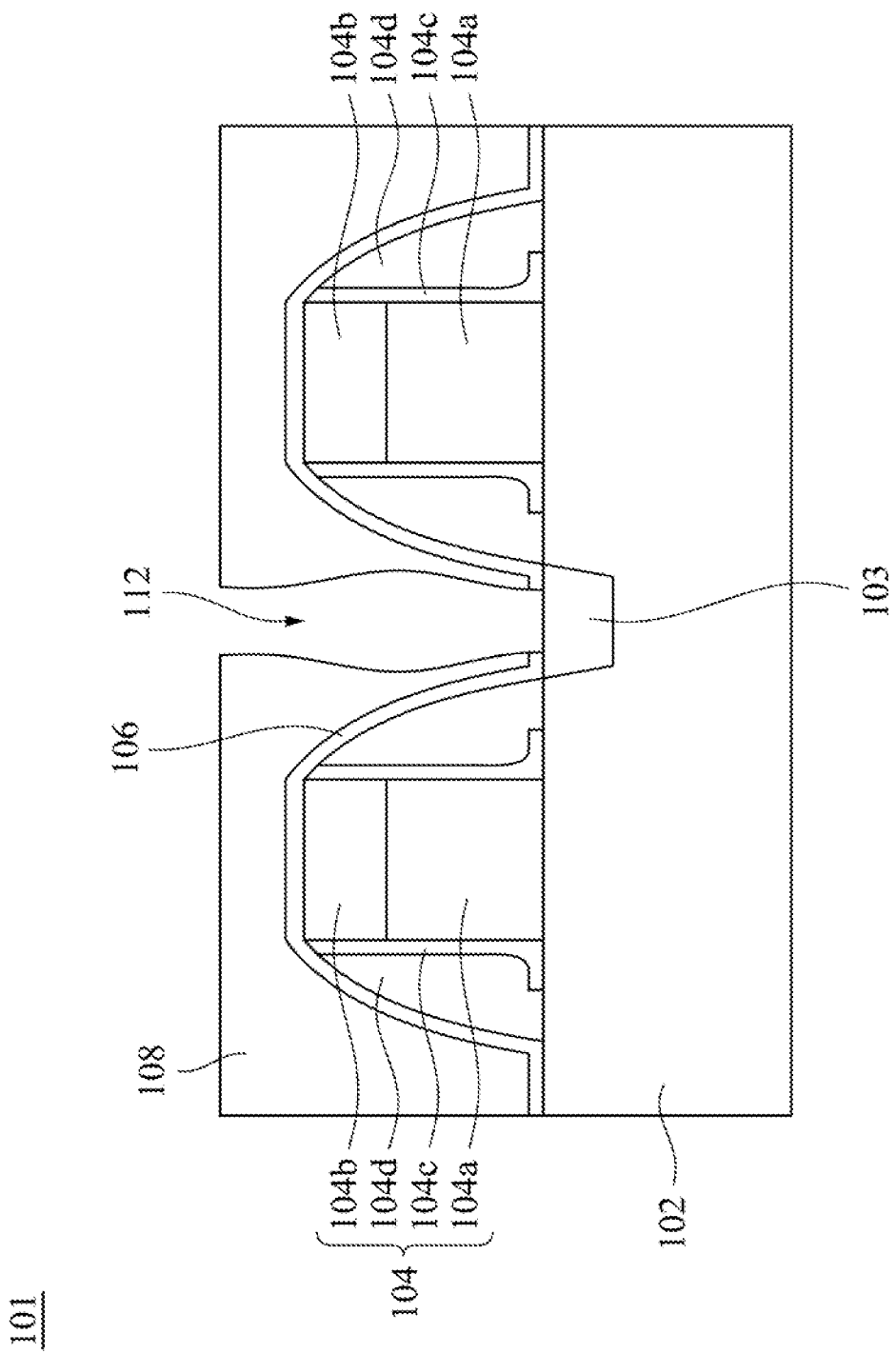
FIGS. 1-7 illustrate cross-section views of intermediate stages of a manufacturing method of a semiconductor device in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

Some embodiments of the present disclosure are related to performing an oxidation process to form a protection layer shifted inwards from a sidewall of a contact opening. Therefore, the width of the contact opening does not shrink, and it is easier to fill metal in the contact opening.

FIGS. 1-7 illustrate cross-section views of intermediate stages of a manufacturing method of a semiconductor device in accordance with some embodiments of the present disclosure. Referring to FIG. 1, a wafer 101 is provided. The wafer 101 may include a substrate 102, gate structures 104 over the substrate 102 and a dielectric layer 108 over the substrate 102 and surrounding the gate structures 104. The substrate 102 may be made of any suitable material, such as silicon. The substrate 102 includes a source/drain region 103. The source/drain region 103 may be formed by implanting dopants into or performing an epitaxial process in the certain region of the substrate 102.

In some embodiments, the source/drain region 103 includes a halo implant region, a lightly-doped drain region, combinations thereof, or the like. The gate structures 104 are arranged over the substrate 102. The gate structure 104 may include a gate electrode 104a, a cap layer (or a hard mask layer) 104b over the gate electrode 104a, spacer liners 104c along the sidewalls of the gate electrodes 104a and the cap layer 104b, and spacers 104d surrounding the spacer liners 104c. The gate electrodes 104a, the cap layers 104b, the spacer liners 104c and the spacers 104d may be made of any suitable materials. In some embodiments, the gate electrodes 104a are made of polycrystalline silicon or metal. The cap layers 104b and the spacer liners 104c, and the spacers 104d are made of insulating materials, such as SiO, SiN, or the like. For example, the cap layers 104b and the spacer liners 104c are made of silicon nitride, and the spacers 104d are made of silicon oxide. The wafer 101 may further include a contact etch stop layer 106 covering the gate structures 104 and the substrate 102. In some embodiments, the contact etch stop layer 106 is made of SiN, SiO, SiON, SiC, SiCN, or the like. The dielectric layer 108 covers the contact etch stop layer 106, the substrate 102 and surrounds the gate structures 104. In some embodiments, the dielectric layer 108 is made of insulating material, such as SiO, SiN, or the like. The contact etch stop layer 106 has an etching selectivity compared to the dielectric layer 108. For example, the contact etch stop layer 106 is made of nitride, and the dielectric layer 108 is made of oxide.

A contact opening 112 is formed in the wafer 101. The contact opening 112 passes through the dielectric layer 108 and the contact etch stop layer 106 and exposes the source/drain region 103. The contact opening 112 may be formed by any suitable method, such as dry etching, wet etching, combinations thereof, or the like. The contour of the contact opening 112 from the cross section view may have any suitable shape. In some embodiments, the contact opening 112 may be wider at the middle and narrower at the top and the bottom, as shown in FIG. 1. In some other embodiments, the contact opening 112 may also be formed with a sidewall vertical to the substrate 102, so the contact opening 112 may have uniform width. In yet some other embodiments, the contact opening 112 may be formed in a tapered shape, and the width of the contact opening 112 becomes wider as being farther away from the source/drain region 103. In some embodiments, a width of the contact opening 112 is in a range from about 35 nm to about 70 nm.

Figure 2:
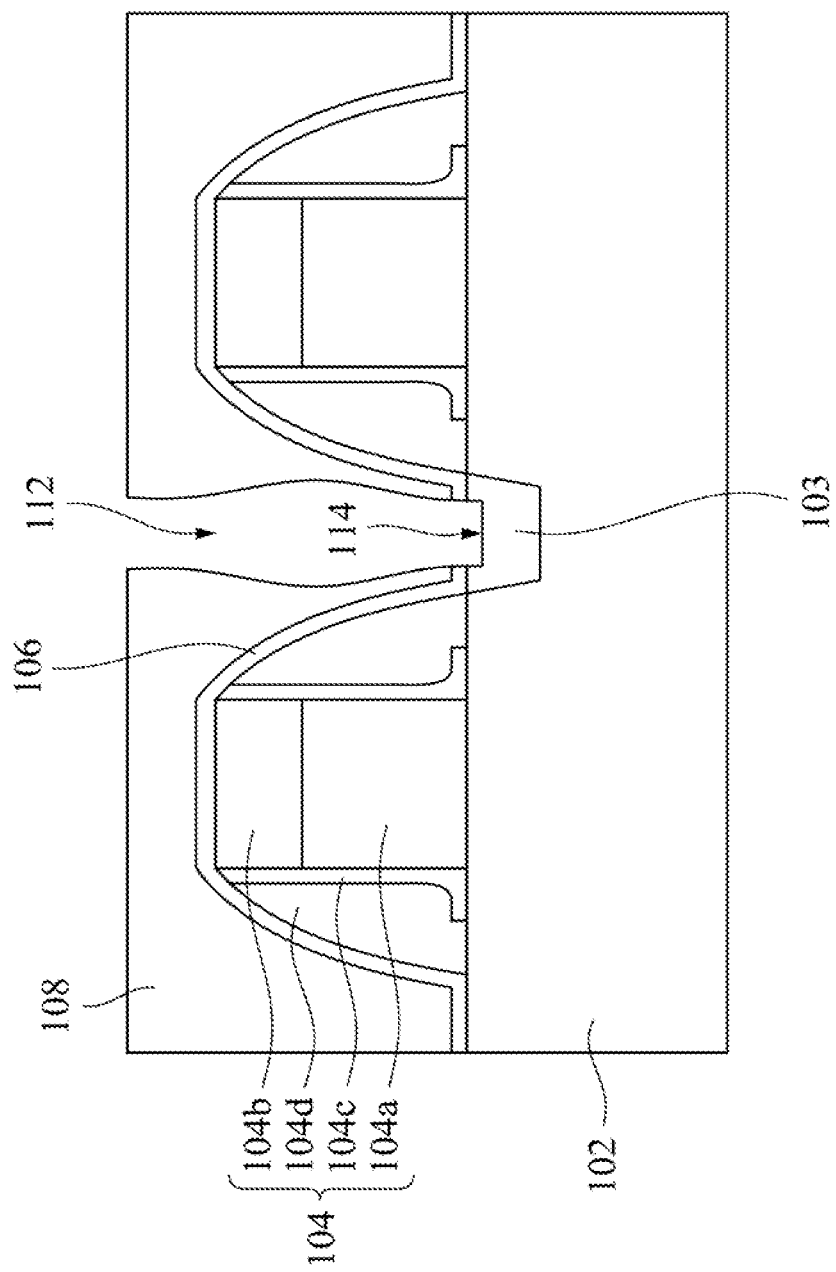

Referring to FIG. 2, a recess 114 is formed in the substrate 102 such that the recess 114 is connected to the contact opening 112. The recess 114 may be formed in the source/drain region 103 of the substrate 102. In some embodiments, the process of forming the contact opening 112 in FIG. 1 and the process of forming the recess 114 in FIG. 2 may be a continuous process, so the contact opening 112 and the recess 114 are formed in the same process.

Alternatively, the contact opening 112 and the recess 114 are formed in different processes. The recess 114 may be formed by any suitable method, such as dry etching, wet etching, combinations thereof, or the like. In some embodiments, a width of the recess 114 is in a range from about 35 nm to about 70 nm. A depth of the recess 114 is in a range from about 15 nm to about 20 nm.

Figure 3:
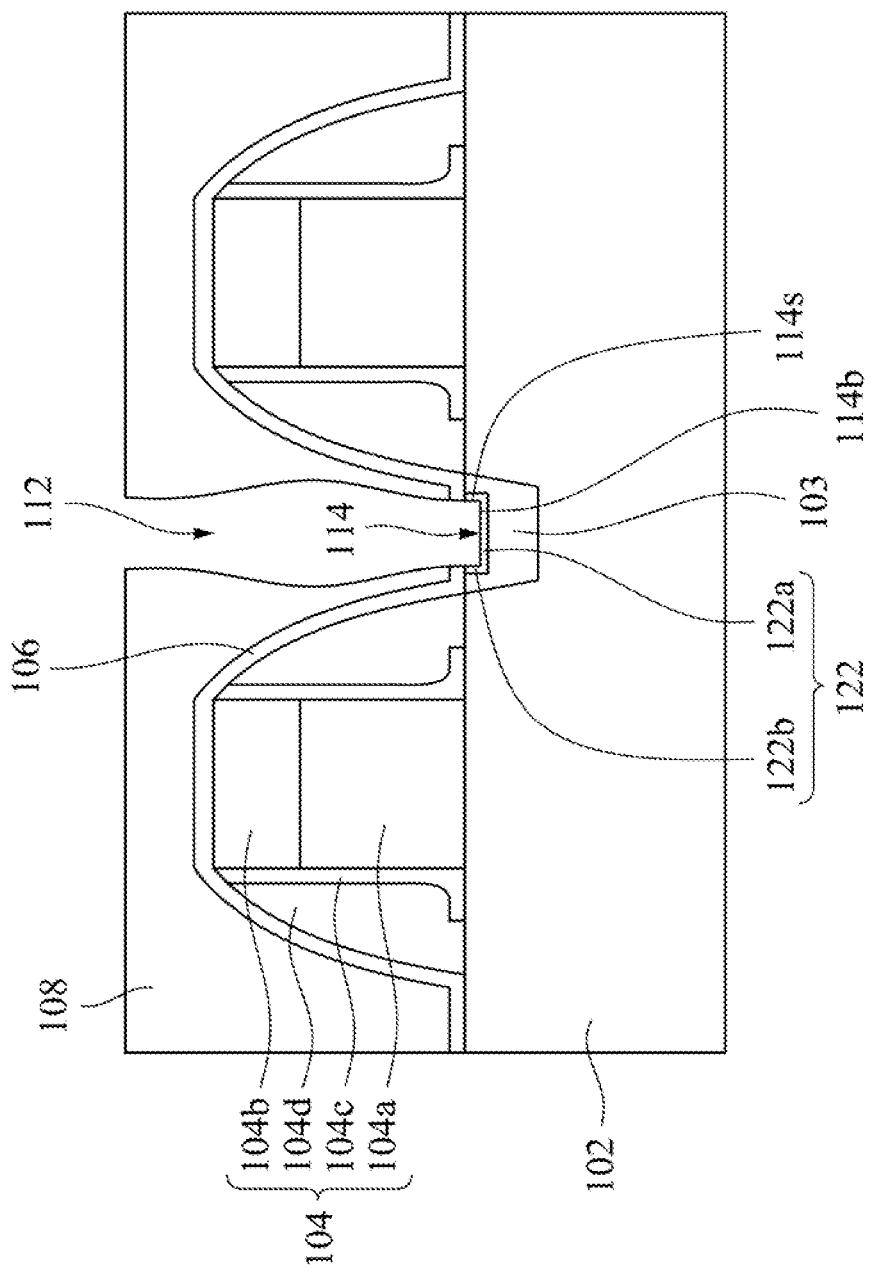

Referring to FIG. 3, an oxidation process is performed to convert a portion of the substrate 102 exposed in the recess 114 to form a protection layer 122. The protection layer includes a first portion 122a lining a bottom surface 114b of the recess 114 and a second portion 122b lining a sidewall 114s of the recess 114. In some embodiments, the oxidation process is an in-situ steam generation (ISSG) process. In the oxidation process, oxygen is introduced to the contact opening 112 in the dielectric layer 108 and the recess 114 in the substrate 102. The oxygen is only reactive to the substrate 102, which may be made of silicon, and is not or barely reactive to the dielectric layer 108, which may be made of dielectric material. Therefore, oxygen reacts to the substrate 102 exposed in the recess 114 to form the protection layer 122 lining the sidewall 114s and the bottom surface 114b of the recess 114 of the substrate 102, and then a portion of the substrate 102 converts into the protection layer 122. The dielectric layer 108 exposed in the contact opening 112 is not or barely reactive to oxygen. Therefore, the material of the dielectric layer 108 remains substantially unchanged after the oxidation process. Oxygen introduced to the recess 114 only reacts to the portion of the substrate 102 near the exposed surface of the recess 114, so the protection layer 122 is only formed near the exposed surface of the recess 114. In some embodiments where the substrate 102 is made of silicon, the protection layer 122 is formed by reaction between oxygen introduced to the recess 114 and silicon in the substrate 102; therefore, the protection layer 122 is a silicon oxide layer. Because the portion of the substrate 102 exposed in the recess 114 is converted to the protection layer 122, the width of the recess 114 is substantially unchanged after the oxidation process. Stated another way, the width of the recess 114 does not shrink in the present disclosure, so conductive materials are more easily filled in the contact opening 112 and the recess 114 in the subsequent process. In some embodiments, hydrogen is introduced accompanied by introducing oxygen to the contact opening 112 of the dielectric layer 108 and the recess 114 of the substrate 102 during the oxidation process.

Figure 4:
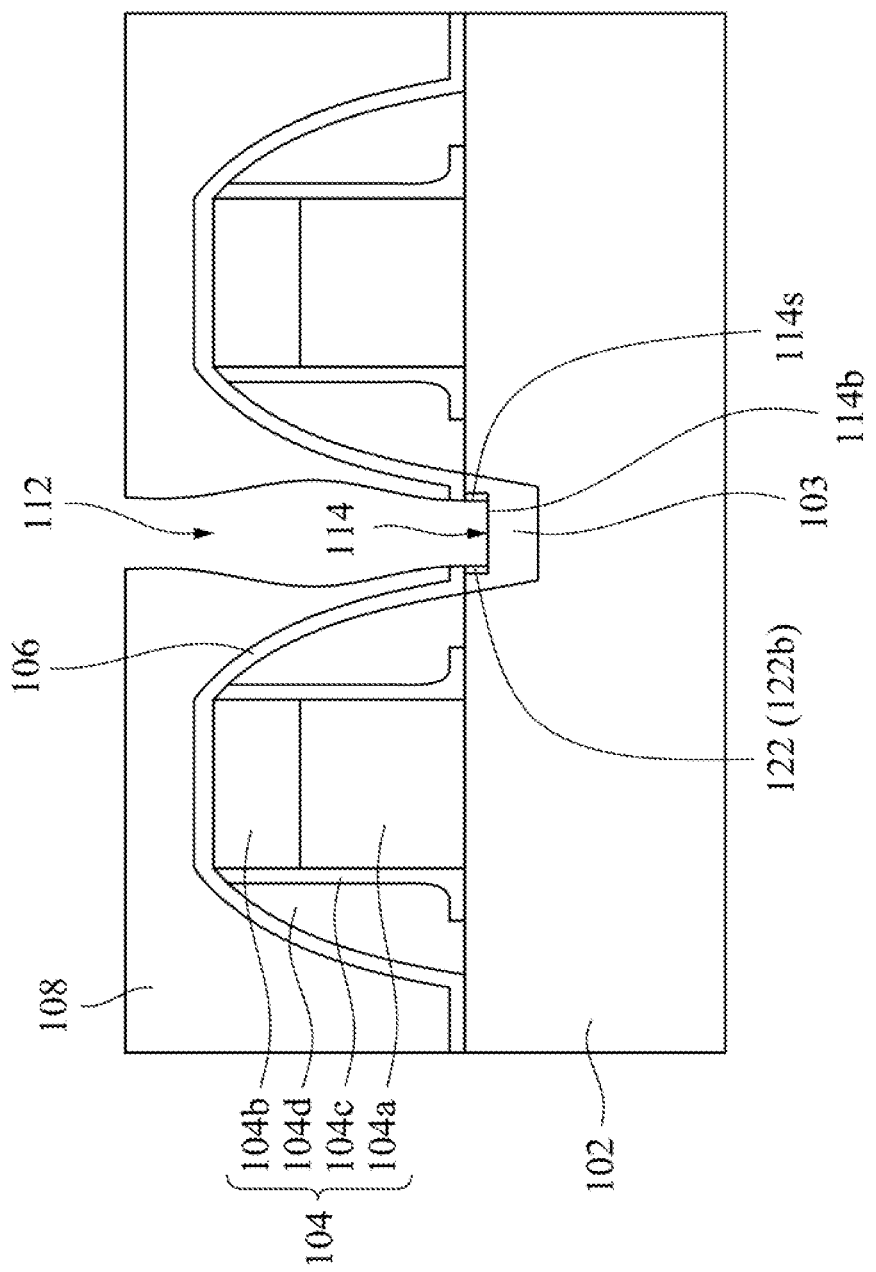

Referring to FIG. 4, the protection layer 122 is etched back to remove the first portion 122a of the protection layer 122 in contact with the bottom surface 114b of the recess 114 of the substrate 102 such that the second portion 122b of the protection layer 122 is in contact with the sidewall 114s of the recess 114 of the substrate 102. The protection layer 122 may be etched back by any suitable method, such as dry etching, wet etching, combinations thereof, or the like. After removing the first portion 122a of the protection layer 122, the substrate 102 (and the source/drain region 103) is exposed in the recess 114.

Figure 5:
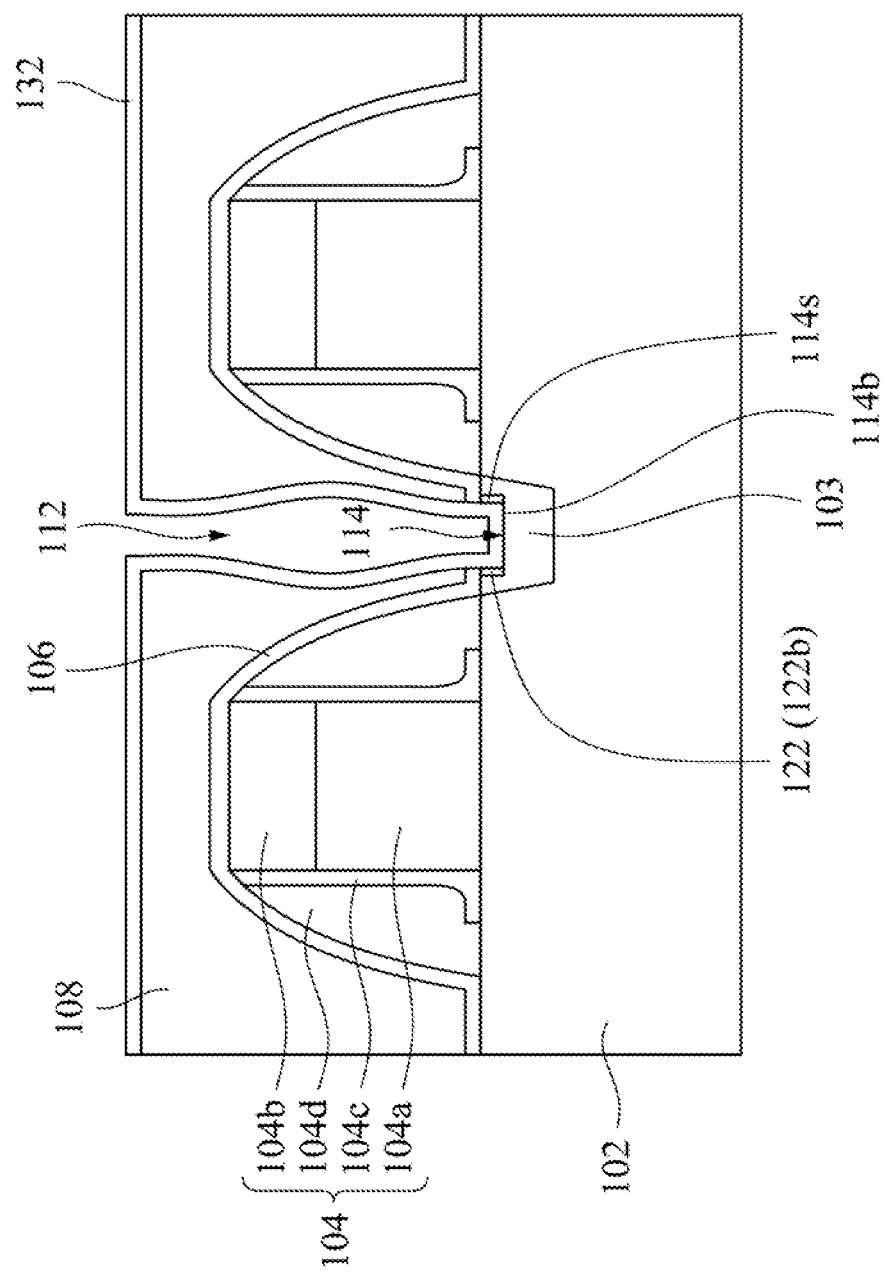

Referring to FIG. 5, a metal layer 132 is deposited over the bottom surface 114b of the recess 114 of the substrate 102. The metal layer 132 may include any suitable material. In some embodiments, the metal layer 132 may include cobalt, titanium, nickel or other suitable metal. The metal layer 132 may formed by any suitable process, such as chemical vapor deposition (CVD), atomic layer deposition (ALD), physical vapor deposition (PVD), or the like. In some embodiments, the metal layer is further conformally deposited over the top surface of the dielectric layer 108 and the sidewall of the contact opening 112.

Figure 6:
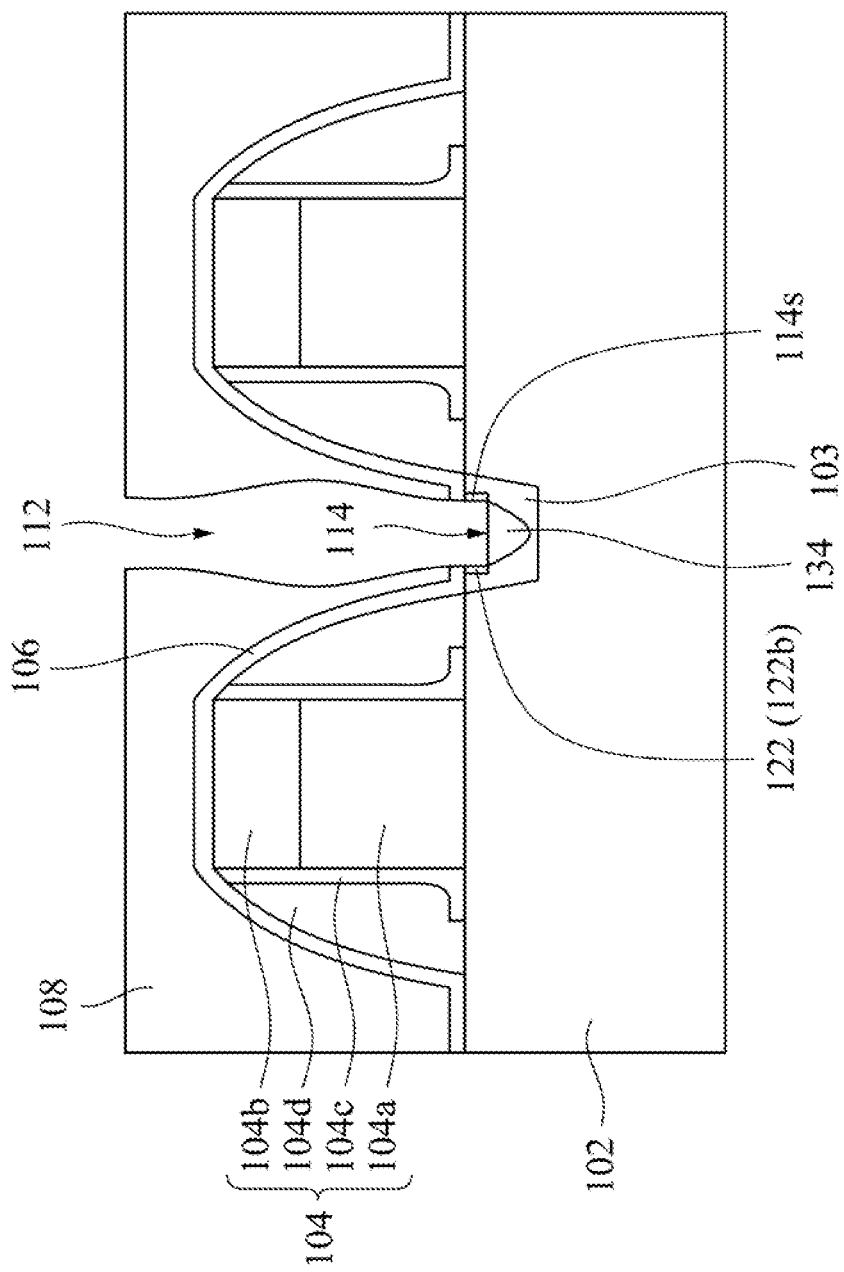

Referring to FIG. 6, a metal alloy structure 134 is formed at the bottom surface 114b of the recess 114 of the substrate 102. Discussed in greater detail, an annealing process is performed to the metal layer 132 such that a portion of the metal layer 132 reacts to the substrate 102 to form the metal alloy structure 134 in the source/drain region 103 of the substrate 102. During the annealing process, the metal layer 132 right over the bottom surface 114b of the recess 114 reacts to the portion of the substrate 102 in contact with the metal layer 132. Material of the substrate 102 reacts with the metal layer 132 to form the metal alloy structure 134. In some embodiments where the metal layer 132 includes cobalt and the substrate 102 includes silicon, the metal alloy structure 134 includes cobalt silicide.

During the annealing process, the protection layer 122 prevents from the metal alloy structure 134 expanding laterally, which may cause leakage from the source/drain region 103 to the gate structures 104. Accordingly, metal of the metal layer 132 is constrained by the protection layer 122 and extends into the substrate 102, and then the metal alloy structure 134 is formed. The metal alloy structure 134 extends downwards into the substrate 102, so the metal alloy structure 134 has a triangle shape in the cross-section view. In some embodiments, the metal alloy structure 134 may have a tapered shape in the cross-section view, and the width of the metal alloy structure 134 may be narrower as being farther away from the bottom surface 114b of the recess 114. During the annealing process, the metal layer 132 lining the sidewall of the contact opening 112 and over the dielectric layer 108 does not react with the dielectric layer 108, and will be removed after the annealing process.

Figure 7:
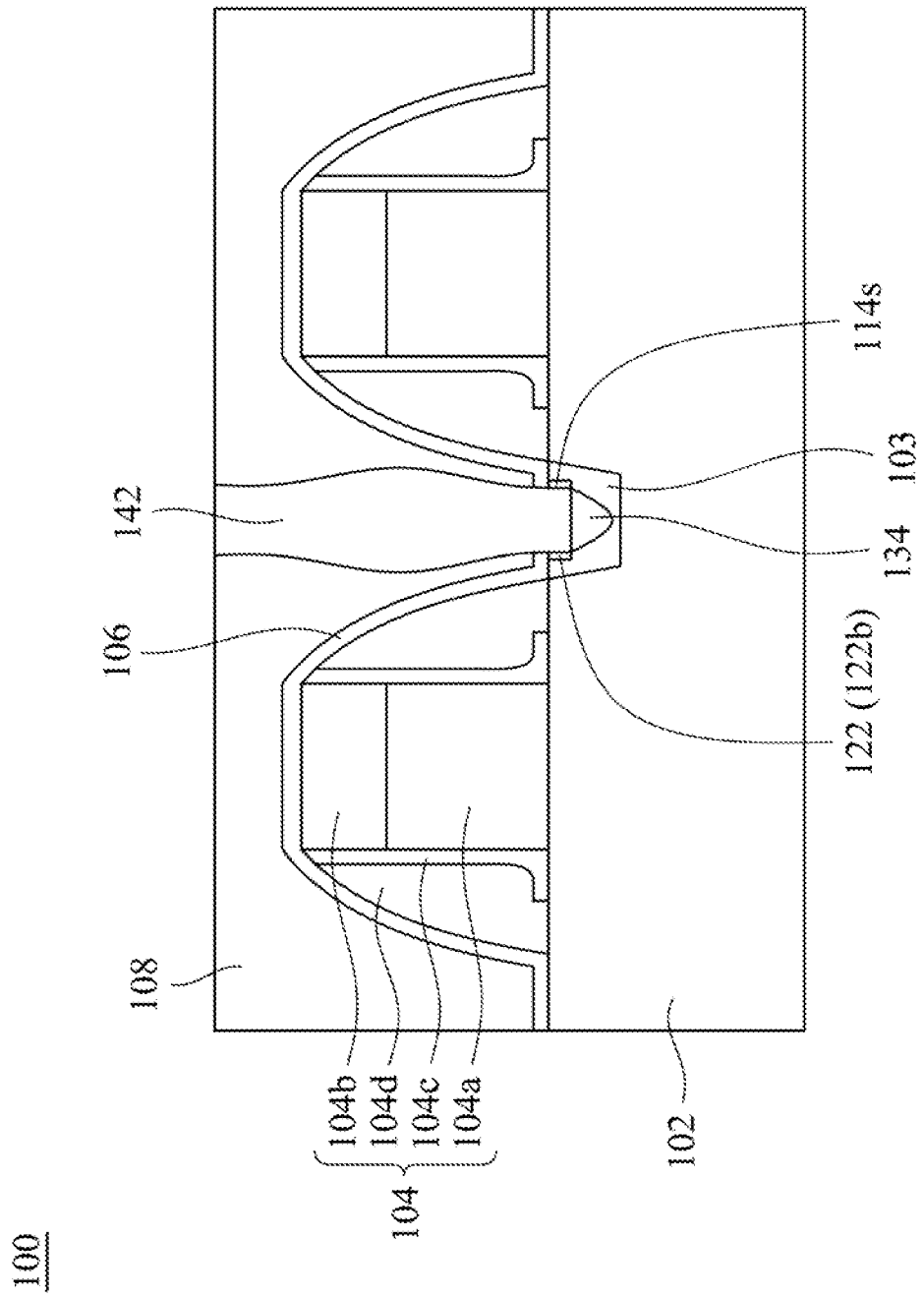

Referring to FIG. 7, a contact 142 is formed in the contact opening 112. The shape of the contact 142 depends on the shape of the contact opening 112. In some embodiments, as shown in FIG. 7, a portion of the contact 142 in contact with the dielectric layer 108 is greater in width than a portion of the contact 142 in contact with the second portion 122b of the protection layer 122. However, the contact 142 may have any suitable shape, such as cylinder or tapered shape. The contact 142 may include conductive material, such as metal. In some embodiments, the metal may include aluminum (Al), copper (Cu), tungsten (W), or the like. The contact 142 may be formed by any suitable method, such as CVD, ALD, PVD, or the like. Because the protection layer 122 does not reduce the width of the recess 114 and the contact opening 112, the contact 142 is easily formed in the contact opening 112 and is formed with fewer voids.

After forming the contact 142 in the contact opening 112, the resulting semiconductor device 100 is shown in FIG. 7. The semiconductor device includes the substrate 102, the gate structures 104, the dielectric layer 108, the contact 142 and the metal alloy structure 134. The gate structures 104 are over the substrate 102. The dielectric layer 108 is over the substrate 102 and surrounds the gate structures 104. The contact 142 extends in the dielectric layer 108 to the substrate 102, and is in contact with the dielectric layer 108 and the second portion 122b of the protection layer 122. The metal alloy structure 134 is at the bottom of the contact 142. The metal alloy structure 134 extends downwards and has a triangle shape in the cross-sectional view. Therefore, the bottom surface of the metal alloy structure 134 is lower than the bottom surface of the protection layer 122.

The semiconductor device 100 further includes the protection layer 122 surrounding a portion of the contact 142 in the substrate 102 and is embedded in the substrate 102. Because the protection layer 122 is formed by the reaction between oxygen and the substrate 102, a portion of the substrate 102, which includes Si, is converted to the protection layer 122, which is made of SiO, the inner sidewall of the protection layer 122 is shifted inwards from the bottom of the sidewall of the contact 142, and the outer sidewall of the protection layer 122 is substantially aligned to the bottom of the sidewall of the contact 142. Therefore, even with the presence of the protection layer 122, the width of the contact 142 still remains unchanged. Moreover, the top surface of the protection layer 122 is lower than the top surface of the contact 142 and is leveled with the top surface of the substrate 102 because the protection layer 122 is only formed in the substrate 102.

The semiconductor device 100 further includes a source/drain region 103 in the substrate 102. The source/drain region 103 may be an ion-implanted region, a doped region or an epitaxial region. The bottom of the contact 142 and the metal alloy structure 134 are in the source/drain region 103. When the semiconductor device 100 is used in an application stage, current passes through the contact 142, the metal alloy structure 134 to the source/drain region 103, but the current may leak to the gate structures 104. With the presence of the protection layer 122, the protection layer 122 prevents from the metal alloy structure 134 expanding from the sidewall of the contact 142 laterally. Hence, the current does not leak from the sidewall of the contact 142; thereby the source/drain region 103 may be formed closer to the gate structures 104.

The semiconductor device 100 further includes the contact etch stop layer 106 between the dielectric layer 108 and the substrate 102 extending from the gate structure 104 to the contact 142. The contact etch stop layer 106 is in contact with the contact 142 and the protection layer 122. More particularly, because the protection layer 122 is formed inwards in the substrate 102, the contact etch stop layer 106 is in contact with the sidewall of the contact 142 and the top surface of the protection layer 122. Stated another way, the protection layer 122 is in contact with the bottom surface of the contact etch stop layer 106.

After forming the semiconductor device 100, subsequent processes may be performed to the semiconductor device 100. For example, an etching process may be performed to remove the dielectric layer 108 and the contact etch stop layer 106 above the gate structure 104, and an interconnect structure may be formed over the gate structure 104. Also, a solder bump may be formed over the contact 142.

Some embodiments of the present disclosure provide advantages. The protection layer is formed by reaction between the substrate and oxygen introduced to the substrate. Therefore, the protection layer is an oxide layer converted from the substrate, and the protection layer does not reduce the width of the recess and contact opening. The subsequently formed material in the recess and the contact opening (such as contact and metal layer) is more easily formed in the recess and the contact opening. For example, the material is formed with fewer voids therein. Also, the protection layer improves the current leakage issues between the source/drain region and the gate structure.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A manufacturing method of a semiconductor device, comprising:
    forming a contact opening in a wafer, wherein the wafer comprises a substrate, a gate structure over the substrate and a dielectric layer over the substrate and surrounding the gate structure, and the contact opening passes through the dielectric layer and exposes the substrate;
    forming a recess in the substrate such that the recess is connected to the contact opening;
    performing an oxidation process to convert a portion of the substrate exposed in the recess to form a protection layer lining a sidewall and a bottom surface of the recess of the substrate;
    etching back the protection layer to remove a first portion of the protection layer in contact with the bottom surface of the recess of the substrate such that a second portion of the protection layer is in contact with the sidewall of the recess of the substrate; and
    forming a metal alloy structure at the bottom surface of the recess of the substrate.

2. The method of claim 1, wherein oxygen is introduced to the contact opening of the dielectric layer and the recess of the substrate to convert the portion of the substrate exposed in the recess to the protection layer.

3. The method of claim 2, wherein hydrogen is introduced accompanied by introducing oxygen to the contact opening of the dielectric layer and the recess of the substrate.

4. The method of claim 1, wherein the protection layer is silicon oxide layer.

5. The method of claim 1, further comprising forming a contact in the contact opening after forming the metal alloy structure at the bottom surface of the recess of the substrate.

6. The method of claim 5, wherein forming the contact in the contact opening is such that the contact is in contact with the dielectric layer and the second portion of the protection layer.

7. The method of claim 6, wherein forming the contact in the contact opening is further such that a portion of the contact in contact with the dielectric layer is greater in width than a portion of the contact in contact with the second portion of the protection layer.

8. The method of claim 1, wherein forming the metal alloy structure at the bottom surface of the recess of the substrate comprises:
    depositing a metal layer over the bottom surface of the recess of the substrate; and
    performing an annealing process to the metal layer such that a portion of the metal layer reacts to the substrate to form the metal alloy structure.

9. The method of claim 8, wherein performing an annealing process to the metal layer is such that the metal alloy structure extends downwards to form in a triangle shape.

10. The method of claim 1, wherein the oxidation process is an in-situ steam generation (ISSG) process.

* * * * *